(12) United States Patent
Greene et al.

(10) Patent No.: US 8,796,771 B2
(45) Date of Patent: Aug. 5, 2014

(54) CREATING ANISOTROPICALLY DIFFUSED JUNCTIONS IN FIELD EFFECT TRANSISTOR DEVICES

(71) Applicant: International Business Machines Corporation, Armonk, NY (US)

(72) Inventors: Brian J. Greene, Wappingers Falls, NY (US); Jeffrey B. Johnson, Essex Junction, VT (US); Qingqing Liang, Fishkill, NY (US); Edward P. Maciejewski, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/053,708

(22) Filed: Oct. 15, 2013

(65) Prior Publication Data

US 2014/0042541 A1     Feb. 13, 2014

Related U.S. Application Data

(62) Division of application No. 12/943,987, filed on Nov. 11, 2010, now Pat. No. 8,633,096.

(51) Int. Cl.
*H01L 29/72*     (2006.01)

(52) U.S. Cl.
USPC .......................................... 257/347; 438/530

(58) Field of Classification Search
USPC .......................................... 257/347; 438/530
See application file for complete search history.

(56) References Cited

U.S. PATENT DOCUMENTS 5,885,861 A * 3/1999 Gardner et al. ............... 438/231

| 6,303,450 B1 | 10/2001 | Park et al. |
| 6,818,938 B1 | 11/2004 | Naem |
| 7,091,522 B2 | 8/2006 | Lee et al. |
| 7,115,945 B2 | 10/2006 | Lee et al. |

(Continued)

FOREIGN PATENT DOCUMENTS

| EP | 0222215 A2 | 5/1987 |
| JP | 3265172 A | 11/1991 |
| JP | 5047726 A | 2/1993 |
| JP | 2000031481 A | 1/2000 |

(Continued)

OTHER PUBLICATIONS

International Search Report; International Application No. PCT/EP2011/069717; International Filing Date: Nov. 9, 2011; Date of Mailing: Jan. 27, 2012; pp. 1-5.

(Continued)

*Primary Examiner* — Edward Wojciechowicz
(74) *Attorney, Agent, or Firm* — Cantor Colburn LLP; Parashos Kalaitzis

(57) ABSTRACT

A method of forming a transistor device includes implanting a diffusion inhibiting species in a semiconductor-on-insulator substrate comprising a bulk substrate, a buried insulator layer, and a semiconductor-on-insulator layer, the semiconductor-on-insulator substrate having one or more gate structures formed thereon such that the diffusion inhibiting species is disposed in portions of the semiconductor-on-insulator layer corresponding to a channel region, and disposed in portions of the buried insulator layer corresponding to source and drain regions. A transistor dopant species is introduced in the source and drain regions. An anneal is performed so as to diffuse the transistor dopant species in a substantially vertical direction while substantially preventing lateral diffusion of the transistor dopant species into the channel region.

12 Claims, 9 Drawing Sheets

(56) References Cited

U.S. PATENT DOCUMENTS

| | | |
|---|---|---|
| 7,205,586 B2 | 4/2007 | Takagi et al. |
| 7,655,523 B2 | 2/2010 | Babcock et al. |
| 7,679,121 B2 | 3/2010 | Ouyang et al. |
| 2002/0033511 A1 | 3/2002 | Babcock et al. |
| 2004/0185629 A1 | 9/2004 | Mansoori et al. |
| 2006/0068555 A1* | 3/2006 | Zhu et al. ............ 438/303 |
| 2007/0252203 A1* | 11/2007 | Zhu et al. ............ 257/345 |
| 2009/0189159 A1 | 7/2009 | Enicks et al. |
| 2010/0012988 A1 | 1/2010 | Yang et al. |

FOREIGN PATENT DOCUMENTS

| | | |
|---|---|---|
| JP | 2006059843 A | 3/2006 |
| JP | 2006108425 A | 4/2006 |
| WO | 2009005785 A1 | 1/2009 |

OTHER PUBLICATIONS

International Search Report—Written Opinion; International Application No. PCT/EP2011/069717; International Filing Date: Nov. 9, 2011; Date of Mailing: Jan. 27, 2012; pp. 1-6.

* cited by examiner

CREATING ANISOTROPICALLY DIFFUSED JUNCTIONS IN FIELD EFFECT TRANSISTOR DEVICES

CROSS-REFERENCE TO RELATED APPLICATION

This application is a divisional of U.S. patent application Ser. No. 12/943,987, filed Nov. 11, 2010, the disclosure of which is incorporated by reference herein in its entirety.

BACKGROUND

The present invention relates generally to semiconductor device manufacturing and, more particularly, to creating anisotropically diffused junctions in field effect transistor (FET) devices.

As the pitch between individual devices on integrated circuits (ICs) continues to shrink with each new technology generation, elements of these devices such as transistor gate electrodes, spacers and source and drain diffusion extents, both lateral and vertical, are required to be sized down accordingly. As a result, FET scaling has become a significant challenge in the semiconductor industry. Traditional scaling techniques such as shallower implants and reduced thermal budgets begin to fail as device dimensions shrink down to the nanometer (nm) regime because control of the abruptness and shallowness of the doping profiles is limited due unavoidable transient-enhanced diffusion. One well-known method to mitigate the inability to create increasingly abrupt and shallow junctions is anti-punchthrough (APT) or halo implantation. These halo implants shield the increasingly small FET channel regions from the encroachment of the source and drain implants and thus help to reduce deleterious short channel effects (SCE). However the resulting highly doped channels or pocket implant regions degrade device performance and power consumption by increasing junction capacitance and band-to-band tunneling.

Moreover, traditional scaling requires the simultaneous reduction of both lateral and vertical dimensions of the transistor, including gate pitch, gate thickness, and source/drain (S/D) junction depth, in order to maintain reasonable short channel control from one node to the next. However, in the sub 90 nm technology nodes, where S/D stress-inducing elements such as eptiaxially grown silicon germanium (eSiGe) and silicon carbon (eSiC) are incorporated for carrier mobility enhancement, scaling the S/D junction depth results in device performance degradation due to stress loss. Additionally, the shallower junctions result in higher S/D series resistance, further degrading the scaled device performance. Finally, in high-performance silicon-on-insulator (SOI) technologies, some portion of the source and drain junctions of each device must encroach sufficiently on the buried insulator, a condition referred to as "butting", in order to isolate adjacent devices that occupy the same contiguous silicon region. Since a typical FET (NFET) junction is formed via self-aligned dopant implantation and subsequent thermal annealing, or by a self-aligned cavity etch and subsequent fill by a heavily in-situ doped strained silicon alloy, a relatively large spacer and high halo implant is typically utilized in order to prevent short channel degradation from the lateral encroachment of the deep source/drain.

SUMMARY

In an exemplary embodiment, a method of forming a transistor device includes implanting a diffusion inhibiting species in a semiconductor-on-insulator substrate comprising a bulk substrate, a buried insulator layer, and a semiconductor-on-insulator layer, the semiconductor-on-insulator substrate having one or more gate structures formed thereon such that the diffusion inhibiting species is disposed in portions of the semiconductor-on-insulator layer corresponding to a channel region, and disposed in portions of the buried insulator layer corresponding to source and drain regions; introducing a transistor dopant species in the source and drain regions; and performing an anneal so as to diffuse the transistor dopant species in a substantially vertical direction while substantially preventing lateral diffusion of the transistor dopant species into the channel region.

In another embodiment, a method of forming a field effect transistor (FET) device includes implanting a diffusion inhibiting species in a silicon-on-insulator (SOI) substrate comprising a bulk substrate, a buried oxide layer (BOX) formed on the bulk substrate, and an SOI layer formed on the BOX layer, the SOI substrate having one or more FET gate structures formed thereon such that the diffusion inhibiting species is disposed in portions of the SOI layer corresponding to a channel region, and disposed in portions of the BOX corresponding to source and drain regions; implanting a first, shallow transistor dopant species in the source and drain regions; implanting a second, deep transistor dopant species in the source and drain regions; and performing an anneal so as to diffuse the second transistor dopant species in a substantially vertical direction while substantially preventing lateral diffusion of the second transistor dopant species into the channel region.

In another embodiment, a method of forming a field effect transistor (FET) device includes implanting a diffusion inhibiting species in a silicon-on-insulator (SOI) substrate comprising a bulk substrate, a buried oxide layer (BOX) formed on the bulk substrate, and an SOI layer formed on the BOX layer, the SOI substrate having one or more FET gate structures formed thereon such that the diffusion inhibiting species is disposed in portions of the SOI layer corresponding to a channel region, and disposed in portions of the BOX corresponding to source and drain regions; implanting a first, shallow transistor dopant species in the source and drain regions; recessing portions of the SOI layer in the source and drain regions; filling the recessed portions of the SOI layer with a semiconductor material that is in-situ doped with a second, deep transistor dopant species in the source and drain regions; and performing an anneal so as to diffuse the second transistor dopant species in a substantially vertical direction while substantially preventing lateral diffusion of the second transistor dopant species into the channel region.

In another embodiment, a transistor device includes a semiconductor-on-insulator substrate comprising a bulk substrate, a buried insulator layer, and a semiconductor-on-insulator layer; a gate structure formed on the semiconductor-on-insulator layer, the gate structure comprising a gate conductor and sidewall spacers adjacent the gate conductor; a diffusion inhibiting species disposed in portions of the semiconductor-on-insulator layer corresponding to a channel region, self-aligned to the gate structure, the diffusion inhibiting species also disposed in portions of the buried insulator layer corresponding to source and drain regions; and a transistor dopant species introduced in the source and drain regions; wherein the transistor dopant species has a substantially vertical profile within the source and drain regions, extending to the buried insulator layer while the channel region is substantially free of the transistor dopant species.

In still another embodiment, a field effect transistor (FET) device, includes a silicon-on-insulator (SOI) substrate comprising a bulk substrate, a buried oxide (BOX) layer, and an SOI layer; a gate structure formed on the SOI layer, the gate structure comprising a gate conductor and sidewall spacers adjacent the gate conductor; a diffusion inhibiting species disposed in portions of the SOI layer corresponding to a channel region, self-aligned to the gate structure, the diffusion inhibiting species also disposed in portions of the BOX layer corresponding to source and drain regions; a first, shallow transistor dopant species implanted in the source and drain regions; and a second, deep transistor dopant species introduced in the source and drain regions; wherein the second transistor dopant species has a substantially vertical profile within the source and drain regions, extending to the BOX layer while the channel region is substantially free of the second transistor dopant species.

BRIEF DESCRIPTION OF THE SEVERAL VIEWS OF THE DRAWINGS

Referring to the exemplary drawings wherein like elements are numbered alike in the several Figures:

FIG. 1(a) is cross sectional view of a silicon-on-insulator (SOI) substrate having a pair of NFET gates formed thereon;

FIG. 1(b) illustrates implantation of a carbon species for the device shown in FIG. 1(a);

FIG. 1(c) illustrates the resulting locations of the carbon regions in the channel regions of the SOI layer below the gate structures, and in the BOX layer below the source and drain regions, following the implantation of FIG. 1(b);

FIG. 1(d) illustrates a shallow source/drain implant of the device shown in FIG. 1(c) using a first dopant;

FIG. 1(e) illustrates a deep source/drain implant of the device shown in FIG. 1(d) using a second dopant;

FIG. 1(f) illustrates a rapid thermal anneal (RTA) process that drives the second dopant of FIG. 1(e) vertically down toward the level of the BOX layer while inhibiting vertical encroachment of the second dopant into the channel regions;

FIG. 2(a) illustrates recessing of the SOI layer in between gate structures following the shallow source/drain implant of FIG. 1(d);

FIG. 2(b) illustrates filling of the recessed areas of the SOI layer in FIG. 2(a) with a silicon or a silicon alloy that is in-situ doped with a second dopant; and FIG. 2(c) illustrates an RTA process that drives the second dopant of FIG. 2(c) vertically down toward the level of the BOX layer while inhibiting vertical encroachment of the second dopant into the channel regions.

DETAILED DESCRIPTION

Figure 1A:
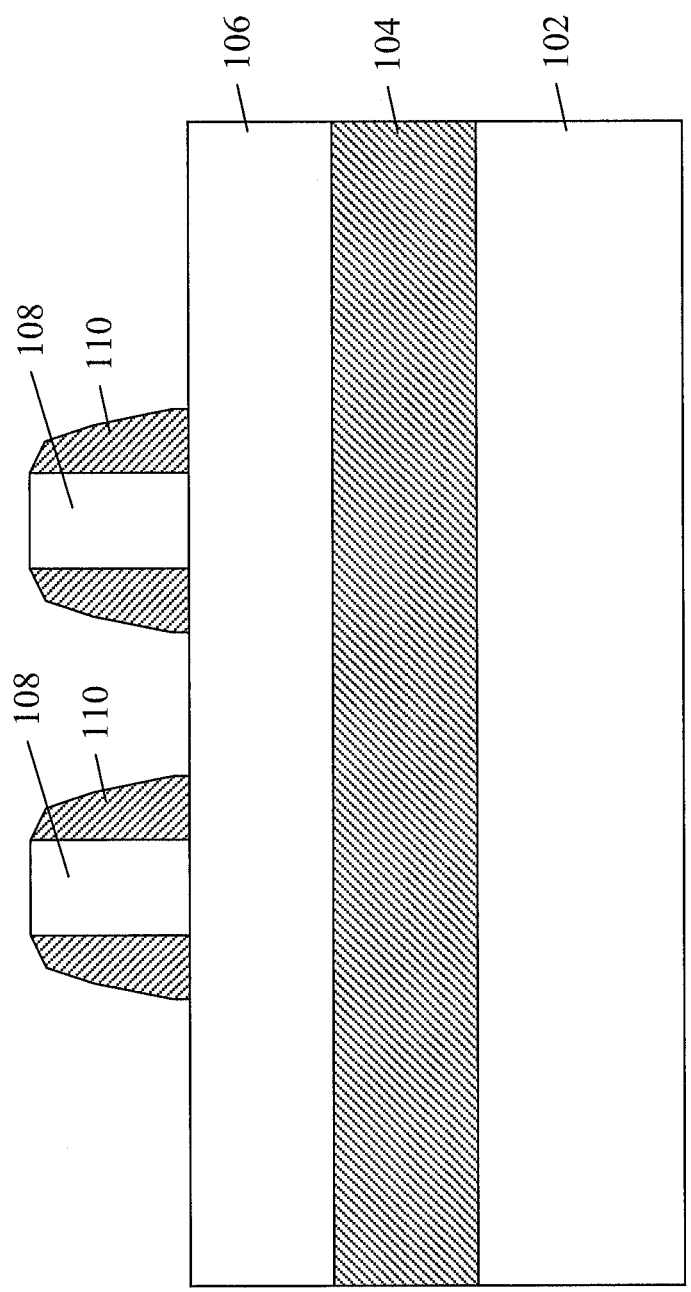
FIGS. 1(a) through 1(f) are cross sectional views of an exemplary method of creating anisotropically diffused junctions in field effect transistor (FET) devices, in accordance with an embodiment of the invention where, in particular.

Disclosed herein is a method and structure for creating anisotropically diffused junctions in field effect transistor (FET) devices. In particular, embodiments of a method to promote vertical diffusion of an NFET and/or a PFET S/D junction and simultaneously inhibit lateral diffusion are disclosed, which embodiments enable a deep source/drain with a relatively modest size spacer and reduced halo implant dose. Consequently, such a process reduces the S/D series resistance of the NFET and/or PFET, and enables the use of thicker silicon-on-insulator (SOI) substrates, which are advantageous for eSiGe p-type FET (PFET) and eSiC n-type FET (NFET) stress optimization. In the following description, boron difluoride ($BF_2$) dopant in a PFET device is equivalent to arsenic (As) dopant in an NFET device, while boron (B) dopant in the PFET device is equivalent to phosphorus (P) dopant in the NFET device.

In the illustrated embodiments below, an exemplary NFET device is illustrated. However, it will be appreciated that the principles herein are equally applicable to PFET devices.

In brief, the embodiments implement a through-gate implant of a diffusion inhibiting species (e.g., carbon) for NFET SOI devices, such that the carbon is incorporated into the channel region (e.g., silicon) under the gate. Elsewhere in the S/D regions, however, the carbon species passes through the SOI layer and into the buried oxide (BOX) layer below the SOI layer. Then, an n-type dopant, such as P for example, is implanted or in-situ doped with regrown semiconductor material into the NFET S/D regions for deep junction formation. Here, the diffusion of P is well-known to be inhibited by carbon. A rapid thermal anneal (RTA) diffuses the phosphorous dopant atoms vertically down toward the BOX layer, effectively butting the junctions and reducing S/D resistance. However, due to the presence of the carbon material previously implanted in the channel region below the gate, the carbon that is effectively self-aligned to the FET channel substantially inhibits lateral diffusion of the phosphorous.

Referring initially to FIG. 1, there is shown a cross sectional view of a semiconductor-on-insulator such as an SOI integrated circuit device 100 having a pair of NFET gates formed thereon, suitable for use in accordance with an embodiment of the invention. As is shown, the device 100 includes a bulk substrate 102, such as silicon for example, a BOX layer 104 or other suitable insulating layer formed on the bulk substrate 102, and a thin SOI layer 106, or other suitable semiconductor-on-insulator layer formed on the BOX layer 104. In addition, a pair of NFET gate structures, each including gate electrodes 108 and sidewall spacers 110, are formed over the SOI layer 106, in accordance with existing semiconductor processing techniques.

Figure 1B:
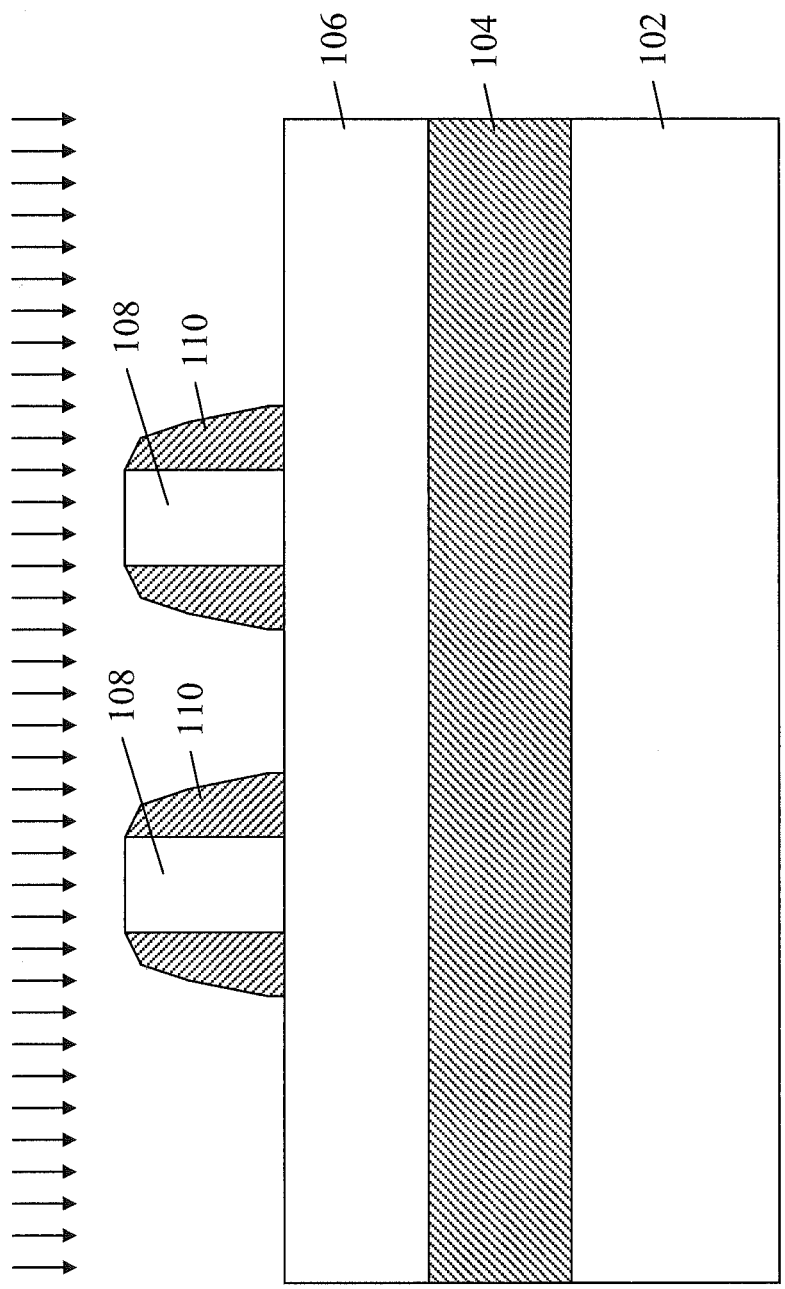
Figure 1C:
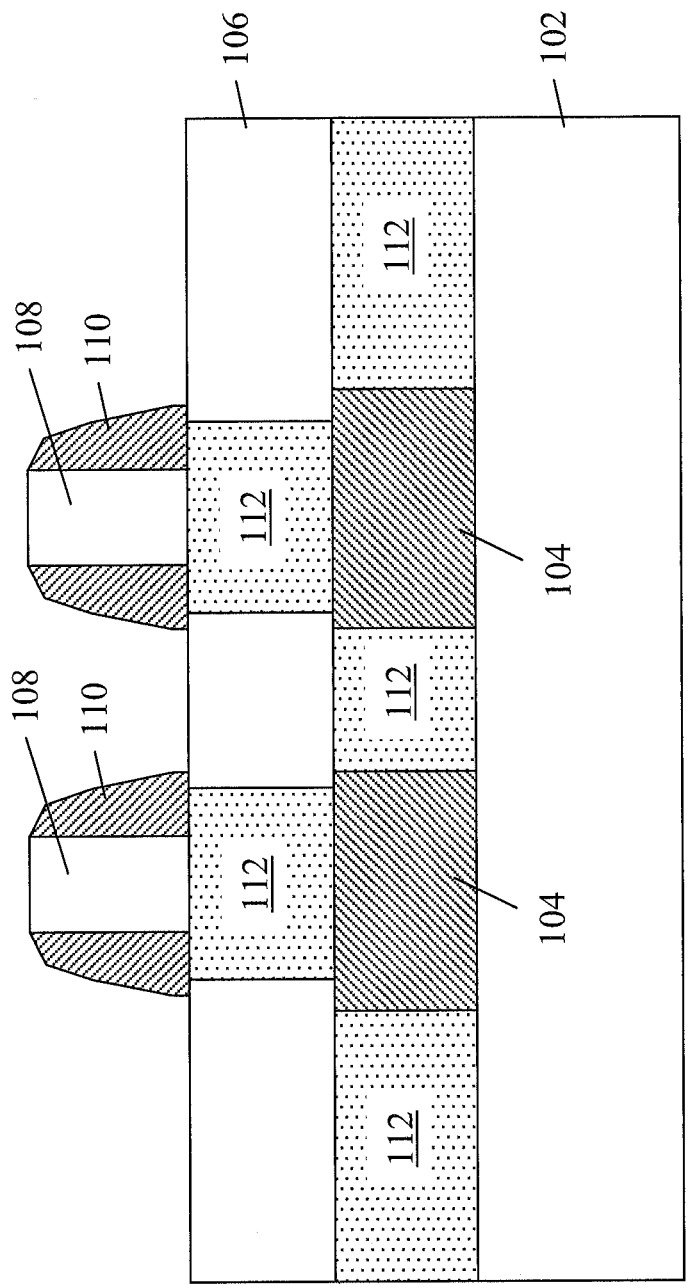

As then shown in FIG. 1(b), the device is subjected to an implant with a species such as carbon (indicated by the arrows) such that the carbon becomes implanted into the channel regions of the SOI layer 106 below the gate electrodes 108, while with respect to the source/drain regions of the SOI layer 106, the carbon passes through the SOI layer and becomes implanted within the BOX layer 104. The resulting intermediate structure is shown in FIG. 1(c), where it will be observed that the carbon regions 112 formed in the SOI layer 106 are self-aligned below the gate electrodes 108 sidewall spacers, while the carbon regions 112 in the BOX layer 104 correspond to locations below the subsequently formed source/drain regions where no gate structures are present.

Figure 1D:
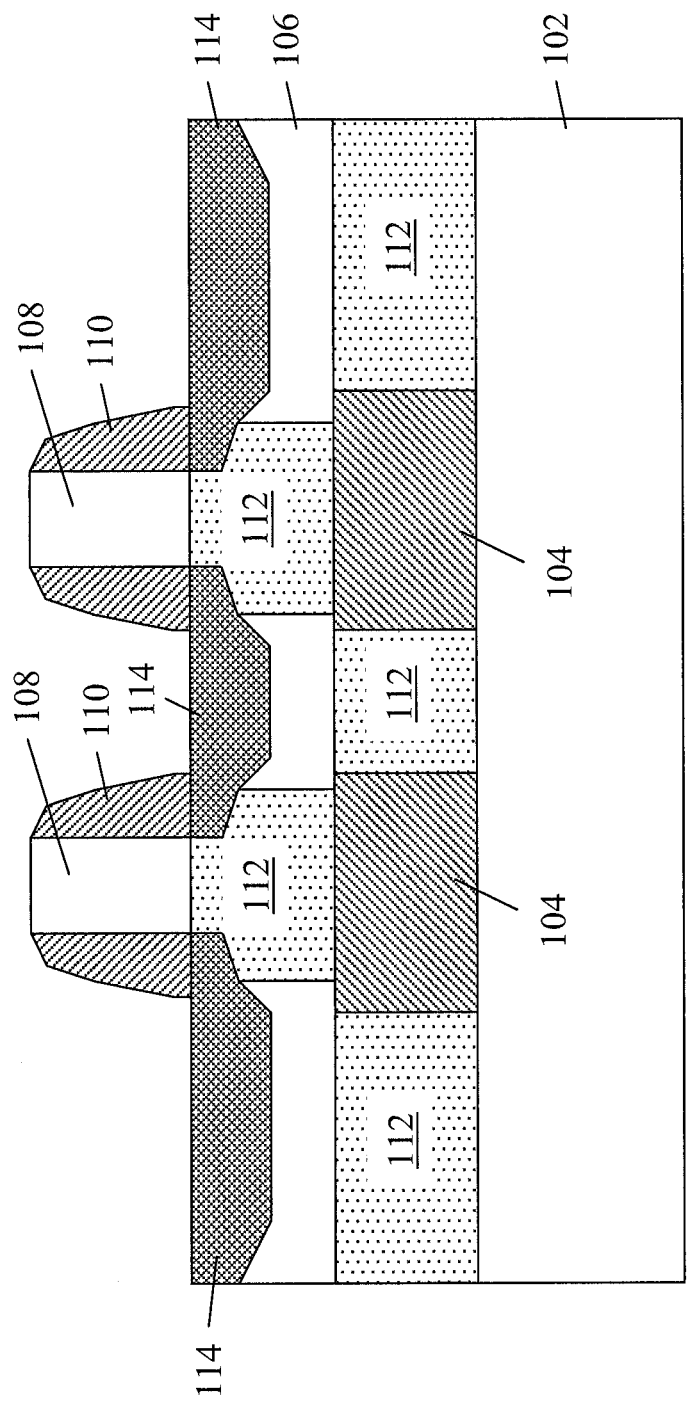
Figure 1E:
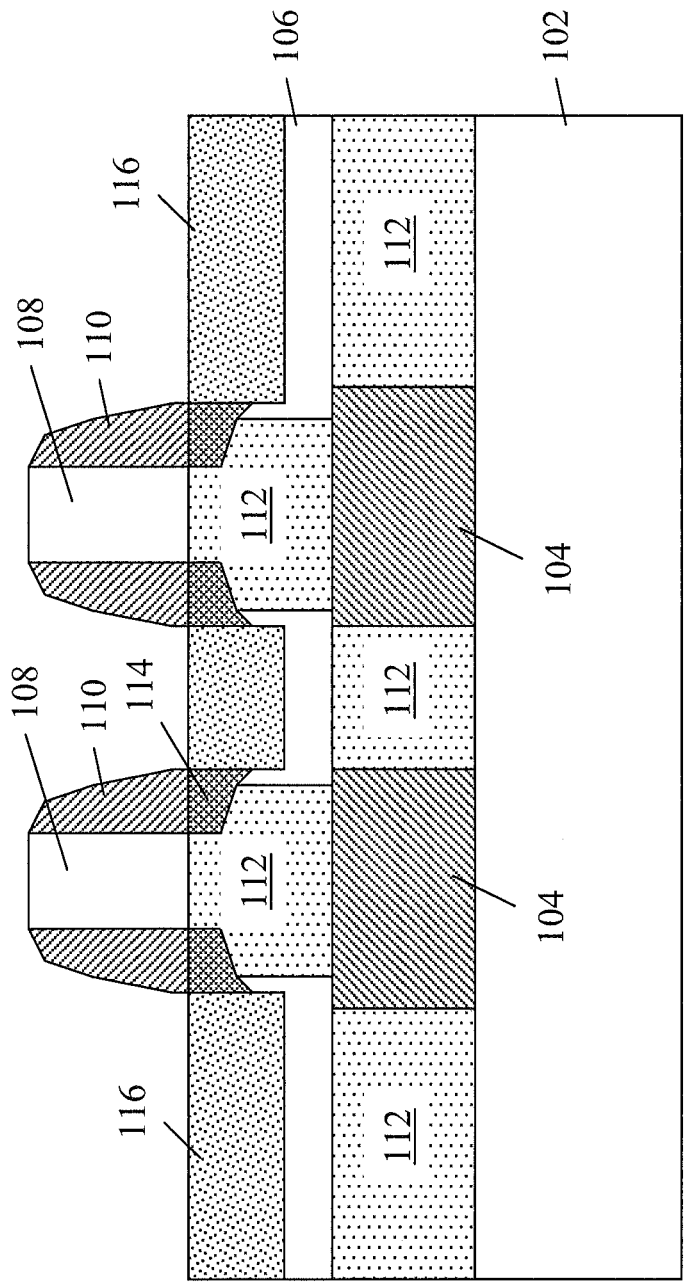

Proceeding now to FIG. 1(d), a first, shallow source/drain implant is performed using a first n-type dopant 114. This first implant is self-aligned to the gate. In an exemplary embodiment, the first n-type dopant 114 is arsenic (As), which also extends beneath the sidewall spacers. Arsenic is the dopant of choice for shallow source/drain junctions because its as-implanted profile is relatively shallow and abrupt and it is resistance to transient-enhanced diffusion. In FIG. 1(e), a second, deep source/drain implant is performed using a second n-type dopant. This second implant is also self-aligned to the gate. In an exemplary embodiment, the second n-type dopant 116 is phosphorous (P). Phosphorus is the dopant species of choice for deep junctions because its as-implanted profile is broad and readily made deep, both relative to that of arsenic. However, in silicon, phosphorus diffuses extremely quickly compared to arsenic.

Figure 1F:
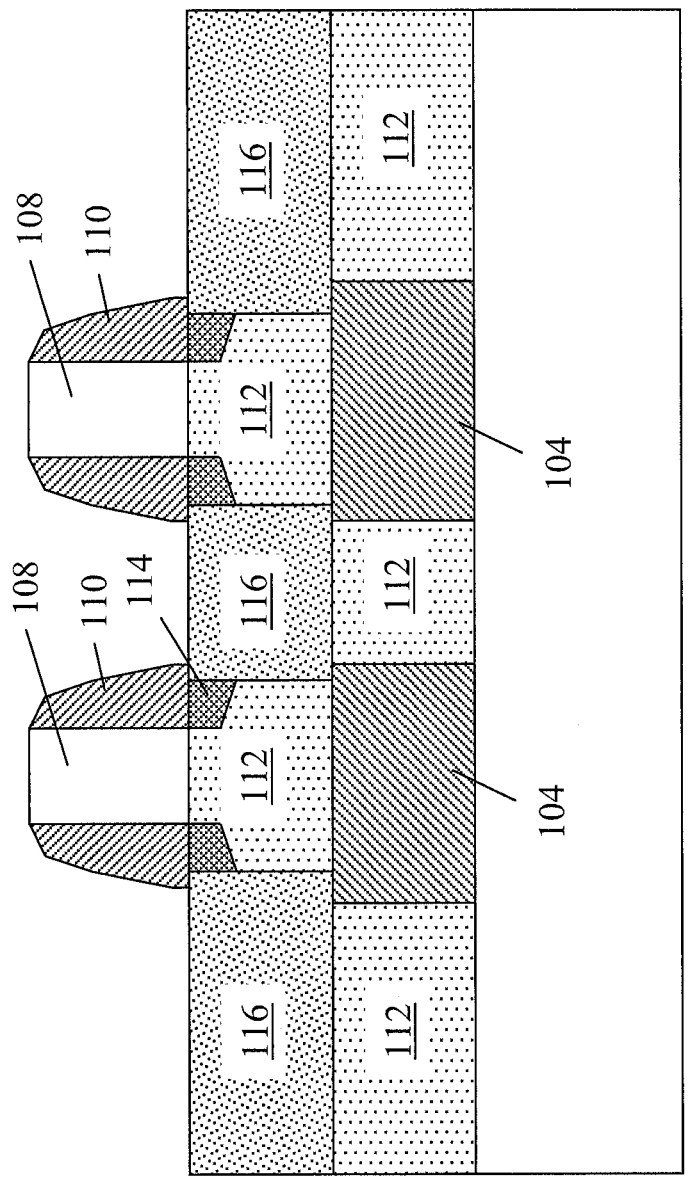

FIG. 1(f) illustrates diffusion of the second-type dopant 116 following an RTA process. As will be seen, the diffusion of the phosphorous species 116 is predominately in a vertical direction, toward the BOX layer 104, due to the presence of the carbon species in the channel regions of the NFET. The uninhibited vertical diffusion enables a butted and low-resistance junction yet avoids short channel effects degradation from lateral encroachment of the dopant into the device channel.

As indicated above, it should be appreciated that although the above described embodiments have been described using NFET devices, the principles disclosed herein are equally applicable to PFET devices. Here, boron difluoride ($BF_2$) may be an analog dopant species of arsenic and boron (B) may be an analog dopant species of phosphorus. With respect to a diffusion inhibiting species, fluorine (F) is a possible, though less desirable, analog of carbon for both NFETs and PFETs.

Figure 2A:
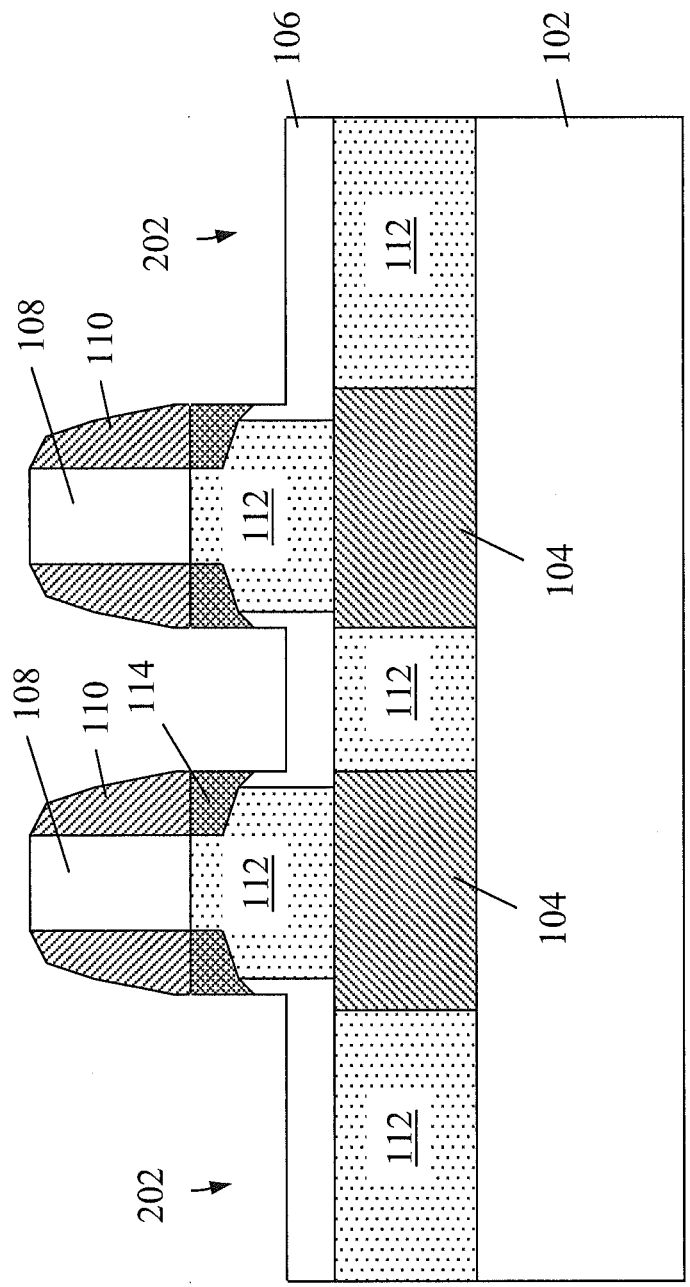
FIGS. 2(a) through 2(c) are cross sectional views of an exemplary method of creating anisotropically diffused junctions in field effect transistor (FET) devices, in accordance with an embodiment of the invention where, in particular.
Figure 2B:
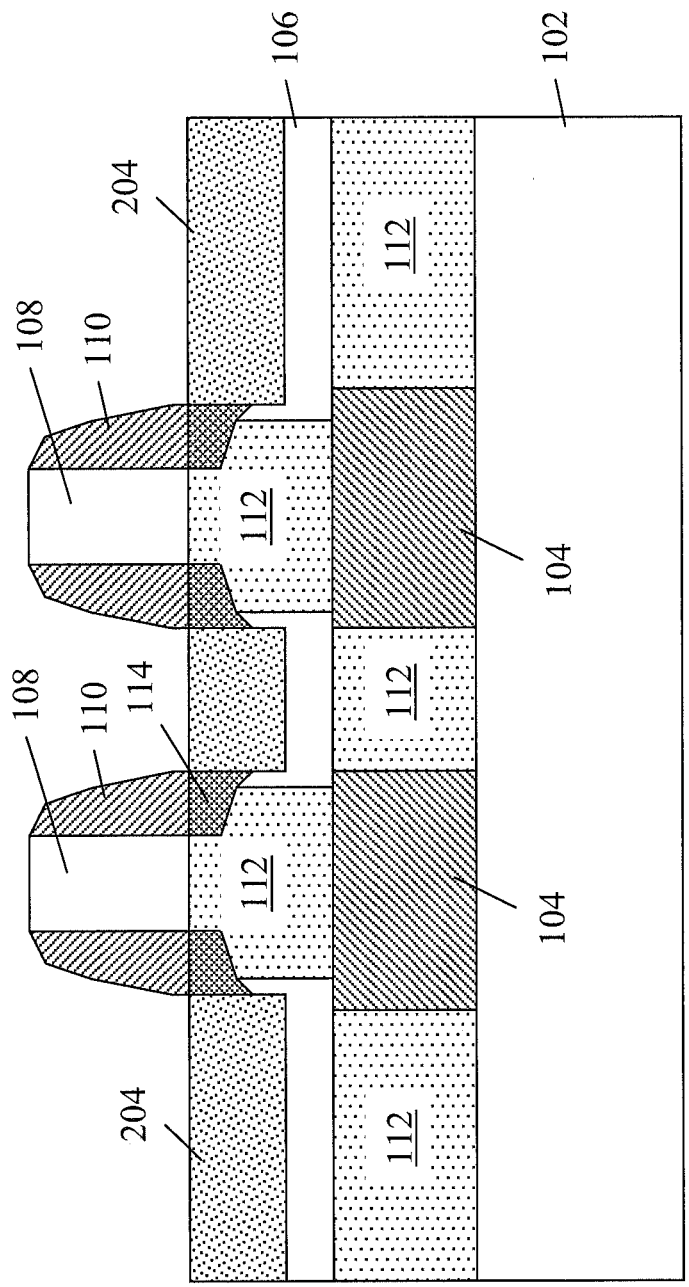
Figure 2C:
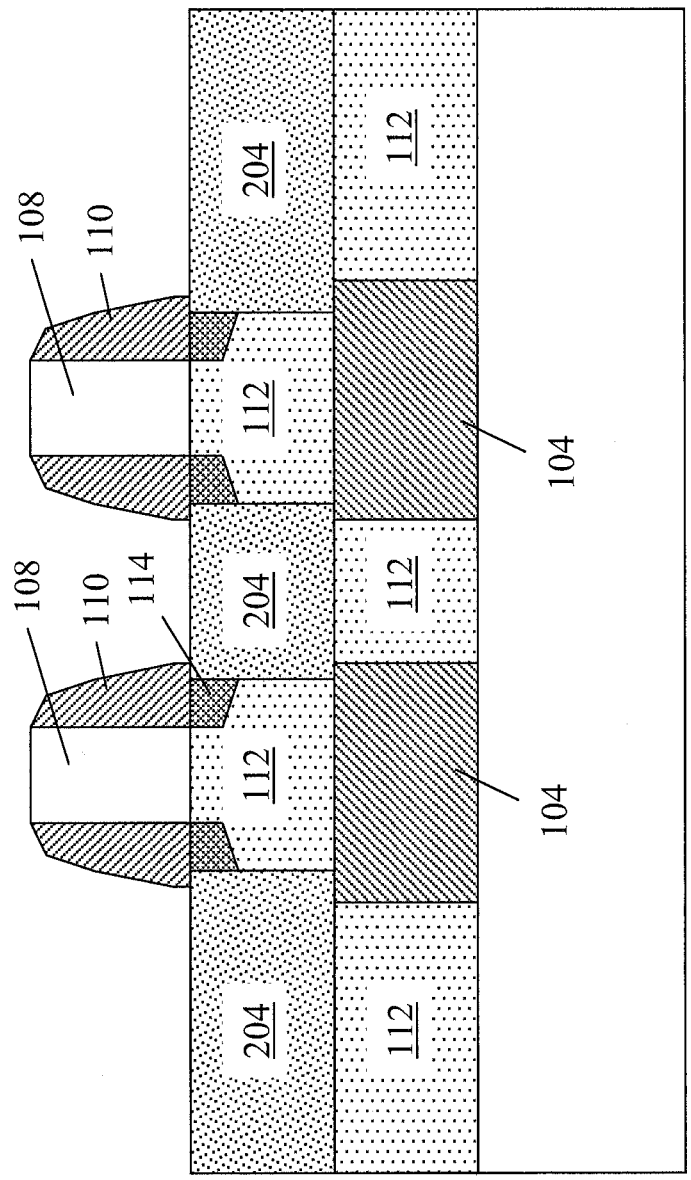

Further, in the above described exemplary embodiments, introduction of the second type (deep) dopant into the source/drain regions is depicted by way of an implant process. In an alternative embodiment, however, this may be performed by SOI etching followed by epitaxial regrowth of the source drain regions with an in-situ doped semiconductor material. Referring now to FIG. 2(a), portions of the SOI layer 106 are recessed such as by etching following a point in processing after the first, shallow source/drain implant process of FIG. 1(d). This results in recessed areas 202 shown in FIG. 2(a). Then, as shown in FIG. 2(b), the recessed areas are filled with an epitaxially grown semiconductor material 204 that is in-situ doped with a suitable second dopant. In the NFET example, the dopant may be phosphorus, while for the PFET example, the dopant may be boron. The semiconductor material may be, for example, silicon, or an alloy of silicon such as silicon germanium (SiGe). Other semiconductor materials could also be used. Finally, as shown in FIG. 2(c), an RTA process diffuses the in-situ dopant of the epitaxially grown semiconductor material 204. As is the case with the implanted embodiment of FIG. 1(e), the diffusion of the in-situ species is predominately in a vertical direction, toward the BOX layer 104, due to the presence of the carbon species in the channel regions of the NFET and the PFET (or, alternatively, the fluorine species in the PFET channel). The uninhibited vertical diffusion enables a butted and low-resistance junction yet avoids short channel effects degradation from lateral encroachment of the dopant into the device channel.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A transistor device, comprising:
a semiconductor-on-insulator substrate comprising a bulk substrate, a buried insulator layer, and a semiconductor-on-insulator layer;
a gate structure formed on the semiconductor-on-insulator layer, the gate structure comprising a gate conductor and sidewall spacers adjacent the gate conductor;
a diffusion inhibiting species disposed in portions of the semiconductor-on-insulator layer corresponding to a channel region, self-aligned to the gate structure, the diffusion inhibiting species also disposed in portions of the buried insulator layer corresponding to source and drain regions; and
a transistor dopant species introduced in the source and drain regions;
wherein the transistor dopant species has a substantially vertical profile within the source and drain regions, extending to the buried insulator layer while the channel region is substantially free of the transistor dopant species.

2. The device of claim 1, wherein the transistor device comprises an n-type field effect transistor (NFET).

3. The device of claim 2, wherein the diffusion inhibiting species comprises carbon, and the transistor dopant species comprises phosphorous.

4. The device of claim 1, wherein the transistor device comprises a p-type field effect transistor (PFET).

5. The device of claim 4, wherein the diffusion inhibiting species comprises fluorine, and the transistor dopant species comprises boron.

6. The device of claim 1, wherein the semiconductor-on-insulator comprises a silicon-on-insulator layer (SOI) and the buried insulator layer comprises a buried oxide (BOX) layer.

7. A field effect transistor (FET) device, comprising:
a silicon-on-insulator (SOI) substrate comprising a bulk substrate, a buried oxide (BOX) layer, and an SOI layer;
a gate structure formed on the SOI layer, the gate structure comprising a gate conductor and sidewall spacers adjacent the gate conductor;
a diffusion inhibiting species disposed in portions of the SOI layer corresponding to a channel region, self-aligned to the gate structure, the diffusion inhibiting species also disposed in portions of the BOX layer corresponding to source and drain regions;
a first, shallow transistor dopant species implanted in the source and drain regions; and
a second, deep transistor dopant species introduced in the source and drain regions;
wherein the second transistor dopant species has a substantially vertical profile within the source and drain regions, extending to the BOX layer while the channel region is substantially free of the second transistor dopant species.

8. The FET device of claim 5, wherein:
the FET device comprises an n-type field effect transistor (NFET);
the diffusion inhibiting species comprises carbon;
first transistor dopant species comprises arsenic; and
the second transistor dopant species comprises phosphorous.

9. The FET device of claim 5, wherein:
the FET device comprises a p-type field effect transistor (PFET);
the diffusion inhibiting species comprises fluorine;
first transistor dopant species comprises boron difluoride; and
the second transistor dopant species comprises boron.

10. The FET device of claim 5, wherein the second transistor dopant species is an implanted species.

11. The FET device of claim 5, wherein the source and drain regions comprise an epitaxially grown semiconductor material in-situ doped with the second transistor dopant species.

12. The FET device of claim 11, wherein the in-situ doped semiconductor material comprises one of silicon and a silicon containing alloy.

* * * * *